United States Patent [19]

Fausone et al.

[11] 4,277,755

[45] Jul. 7, 1981

[54] CIRCUIT ARRANGEMENT FOR DRIVING NONLINEAR THRESHOLD DEVICES

[75] Inventors: Alfredo Fausone; Vittorio Seano, both of Turin, Italy

[73] Assignee: CSELT - Centro Studi e Laboratori Telecomunicazioni S.p.A., Turin, Italy

[21] Appl. No.: 81,931

[22] Filed: Oct. 4, 1979

[30] Foreign Application Priority Data

Oct. 5, 1978 [IT] Italy .............................. 69299 A/78

[51] Int. Cl.³ .............................................. H03D 3/04
[52] U.S. Cl. .................................... 330/128; 330/131; 307/311; 250/552
[58] Field of Search ...................... 330/128, 131, 278; 307/311; 250/552

[56] References Cited

U.S. PATENT DOCUMENTS

| 2,761,919 | 9/1956 | Stillwell | 330/128 |
| 2,857,481 | 10/1958 | Philips | 330/131 |

Primary Examiner—David K. Moore
Assistant Examiner—T. N. Grigsby
Attorney, Agent, or Firm—Karl F. Ross

[57] ABSTRACT

A nonlinear signal transducer U, such as a light-emitting diode or a semiconductive laser, is maintained at a suitable operating point by a constant biasing current and receives an electrical input signal by way of a series resistor R from a main amplifier AM of variable gain. The output voltage of the main amplifier is detected and integrated to provide a first reference voltage which is compared with the load voltage of the transducer U in a differential amplifier AE1, forming part of a first feedback loop, to adjust a voltage generator GT controlling the output voltage of the main amplifier AM so as to eliminate any voltage drop across the series resistor R as long as the input signal is absent or has an instantaneous magnitude equal to its mean value. A second feedback loop includes a peak-to-peak detector DP which emits a voltage proportional to the signal amplitude, that voltage being compared with a second reference voltage in a differential amplifier AE2 serving to adjust a current generator GC1 which controls the gain of the main amplifier AM. The second reference voltage may be varied manually or in response to changes in the output of the transducer U.

6 Claims, 2 Drawing Figures

CIRCUIT ARRANGEMENT FOR DRIVING NONLINEAR THRESHOLD DEVICES

FIELD OF THE INVENTION

Our present invention relates to a circuit arrangement for driving a nonlinear device, e.g. an electro-optical transducer, in response to an electrical input signal.

BACKGROUND OF THE INVENTION

Devices of the type here contemplated, e.g. light-emitting diodes, semiconductive lasers or Gunn microwave diodes, generally require the flow of a biasing current designed to establish a suitable operating point on a more or less linear part of their characteristic in the absence of an input signal. This operating point is usually located at or somewhat above a predetermined threshold which, however, can vary from one device to another and is also subject to change, due to such factors as temperature fluctuations and aging, in a given device. Thus, the potential established by the biasing current at the driving input of the device is neither exactly predictable nor constant.

Any potential difference existing under zero-signal conditions between this driving input and the output of an associated signal amplifier may be harmful to that amplifier and/or to the device itself besides impairing the response of that device to the applied driving signal.

OBJECTS OF THE INVENTION

The general object of our present invention, therefore, is to provide means for eliminating such a potential difference between the output of a driving amplifier and the signal input of a nonlinear device traversed by a constant biasing current, particularly—but not exclusively—where that device is an electro-optical transducer driven by data pulses.

An ancillary object, applicable to a system in which the nonlinear device is a transducer driven by a train of data pulses, is to provide means for controlling the gain of the driving amplifier with a view to stabilizing the power of the output signal emitted by the transducer.

SUMMARY OF THE INVENTION

In accordance with our present invention, a series impedance is inserted between a nonlinear device traversed by a biasing current and an output of an associated amplifier receiving the input signal designed to drive that device. This input signal is advantageously a balanced train of data pulses superposed on a d-c pedestal. The same output is connected to a detector and integrator establishing a base-level voltage corresponding to the pedestal or zero-bit level of the driving voltage appearing under no-signal conditions on this output. A comparison circuit has input connections to the integrator and to the nonlinear device for receiving an instantaneous load voltage developed across the latter and emitting an error signal proportional to the difference between that load voltage and the base-level voltage generated by the integrator. The driving voltage at the amplifier output is modified by control means connected between the comparison circuit and the amplifier so as substantially to eliminate current flow through the series impedance in the absence of an input signal.

Pursuant to a more particular feature of our invention, usable in data-transmission systems, the feedback path including the aforementioned integrator, comparison circuit and control means is supplemented by another feedback path including a peak detector connected to the amplifier output for generating a measuring voltage proportional to the amplitude of the driving pulses emitted in the presence of an input signal, a source of reference voltage, and a comparator having input connections to the peak detector and to the reference-voltage source for emitting a gain-control signal proportional to the difference between the reference and measuring voltages. This latter feedback path modifies the amplitude of the driving pulses in response to the gain-control signal generated by the last-mentioned comparator whose operation, in turn, depends on the applied reference voltage. The source of that voltage may be adjustable either manually or, for stabilization purposes, by a feedback signal applied to a control input thereof from the nonlinear device.

BRIEF DESCRIPTION OF THE DRAWING

The above and other features of our present invention will now be described in detail with reference to the accompanying drawing in which.

SPECIFIC DESCRIPTION

Figure 1:
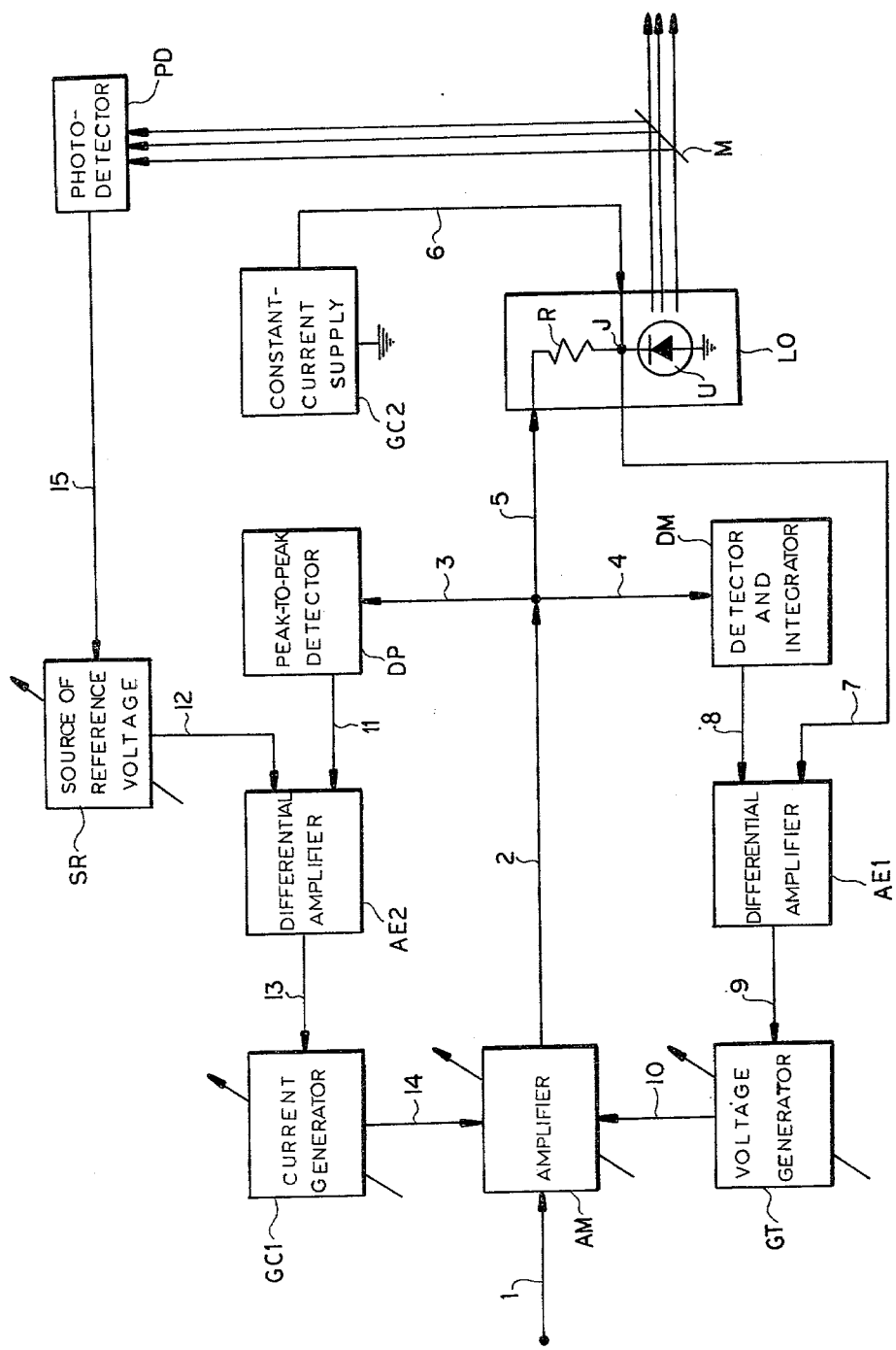
FIG. 1 is a block diagram illustrating a circuit arrangement embodying our invention.

In FIG. 1 we have illustrated a circuit arrangement for driving a load LO which includes a photo-optical transducer U, such as a semiconductor laser, designed to irradiate a light-conducting fiber with light pulses corresponding to electrical data pulses applied to an input 1 of a main amplifier AM. The output 2 of this amplifier has three branches 3, 4 and 5; branch 5 is connected via a series resistor R, forming part of load LO, to an ungrounded terminal J of transducer U.

The amplified data pulses appearing on output lead 2 are fed via branch 4 to a detector/integrator DM which derives from them a base-level or first reference voltage emitted via a lead 8 to one input of a differential amplifier AE1 whose other input is connected by a lead 7 to the junction J of resistor R with transducer U. Amplifier AE1 has an output lead 9 extending to an adjustable voltage generator GT which feeds a control input 10 of main amplifier AM. Transducer U is traversed by a constant biasing current delivered to junction J via a lead 6 from a d-c supply GC2.

Components DM, AE1 and GT constitute a first feedback path which, in response to an error signal appearing on lead 9, establishes on output lead 2 of amplifier AM—in the absence of an input signal on lead 1—a quiescent voltage which equals the load voltage at the point J so that resistor R is not traversed by current in either direction. With current supply GC2 suitably chosen to bias the transducer U above its operating threshold, this load voltage is subject to certain variations as discussed above.

Branch 3 extends to a peak-to-peak detector DP which forms part of a second feedback path and emits on a lead 11 a measuring voltage proportional to the amplitude of the applied signal pulses. Lead 11 terminates at one input of a differential amplifier AE2 whose other input receives, via a lead 12, a second reference voltage from a preferably adjustable source SR. In response to the difference between the voltages appearing on leads 11 and 12, amplifier AE2 emits on a lead 13 a gain-control signal fed to an adjustable current generator GC1 which works into another control input 14 of amplifier AM. This second feedback path DP, AE2, GC1 may be deactivated by suitable means when no signal is being received at input 1.

In the presence of such an input signal, the amplitude of the driving pulses appearing on lead 2 may be modified by adjusting the output of source SR either manually or automatically. For the latter purposes there has been shown in FIG. 1 a partly transparent mirror M which reflects a small fraction of the light beam from transducer U to a photodetector PD; the latter, which includes integrating circuitry, delivers a control signal to source SR via a lead 15 in order to maintain a substantially constant average signal power in the output of the transducer.

Figure 2:
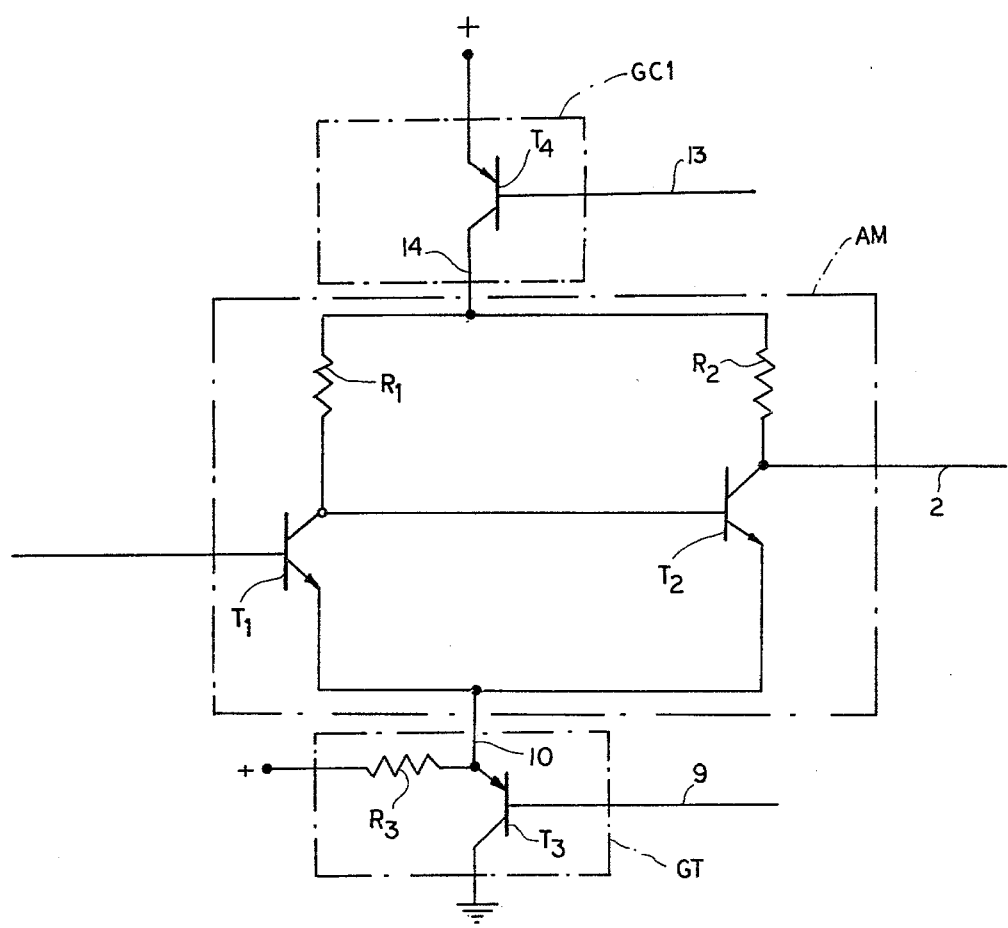
FIG. 2 is a more detailed circuit diagram of certain components of the arrangement of FIG. 1.

In FIG. 2 we have illustrated amplifier AM, voltage generator GT and current generator GC1 in greater detail. The amplifier is shown to comprise two cascaded NPN transistors $T_1$ and $T_2$ connected in the common-emitter mode to the voltage generator GT to operate as Class B or Class C amplifier stages. Voltage generator GT comprises a PNP transistor $T_3$ connected to ground in the common-collector mode. Current generator GC1 comprises another PNP transistor $T_4$ connected in the common-emitter mode to positive voltage, its collector being joined to those of transistors $T_1$ and $T_2$ via respective resistors $R_1$ and $R_2$. Transistor $T_3$ has its emitter connected by way of a further resistor $R_3$ to positive voltage.

As will be readily apparent, an error signal delivered via lead 9 to the base of transistor $T_3$ modifies the emitter potential of amplifier stages $T_1$ and $T_2$, joined to lead 10, so as to change the voltage of output lead 2 in the zero-signal state of input lead 1 until the error signal disappears. If, as assumed above, the incoming signal is a train of balanced data pulses, its appearance will not result in any change of the reference voltage emitted by integrator DM on lead 8; even if the signal is unbalanced, this will be substantially the case as long as the time constant of circuit DM is sufficiently large. In any event, instantaneous signal deviations from the output voltage of the integrator will be intensified by the resulting error signal so that amplifier AM would also faithfully reproduce on output lead 2 the bits "0" and "1" from input lead 1 if the potential of lead 8 were to depart somewhat from its normal level during signal reception.

The collector current supplied to amplifier AM by transistor $T_4$ of generator GC1, varying with the gain-control voltage present on lead 13, determines the amplification factor and therefore the amplitude of the pulses emitted on lead 2. When the feedback path including detector DP is made inoperative during periods in which no input signal is being received, a fixed potential of suitable magnitude is applied to lead 13 by differential amplifier AE2.

We claim:

1. A circuit arrangement for driving a nonlinear device, comprising:
    adjustable amplifier means having an output connected via a series impedance to the nonlinear device to be driven;
    a supply of biasing connected to said nonlinear device for establishing a predetermined operating point in the absence of an input signal fed to said amplifier means;
    integrating means connected to said output for establishing a base-level voltage proportional to a no-signal value of a driving voltage appearing on said output;
    comparison means with input connections to said integrating means and to said nonlinear device for receiving an instantaneous load voltage developed across the latter, together with said base-level voltage, and emitting an error signal proportional to the difference between said load and base-level voltages; and
    control means connected between said comparison means and said amplifier means for modifying said driving voltage in response to said error signal so as substantially to eliminate current flow through said series impedance in the absence of said input signal.

2. A circuit arrangement as defined in claim 1, further comprising peak-detecting means connected to said output for generating a measuring voltage proportional to the amplitude of said driving voltage in the presence of an input signal, a source of reference voltage, a comparator with input connections to said peak-detecting means and said source for emitting a gain-control signal proportional to the difference between said reference and measuring voltages, and feedback means extending from said comparator to said amplifier means for modifying said amplitude in response to said gain-control signal.

3. A circuit arrangement as defined in claim 2 wherein said feedback means comprises an adjustable current generator.

4. A circuit arrangement as defined in claim 1, 2 or 3 wherein said control means comprises an adjustable voltage generator.

5. A circuit arrangement as defined in claim 2 or 3 wherein said source is manually adjustable.

6. A circuit arrangement as defined in claim 2 or 3 wherein said source is adjustable by a feedback signal applied to a control input thereof from said nonlinear device.

* * * * *